(12) United States Patent
Carugati

(10) Patent No.: US 8,521,114 B2
(45) Date of Patent: Aug. 27, 2013

(54) PIN-DIODE LINEARIZED AUTOMATIC GAIN CONTROL CIRCUITS

(75) Inventor: Antonio Carugati, Desio (MI) (IT)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 306 days.

(21) Appl. No.: 12/918,913

(22) PCT Filed: Feb. 22, 2008

(86) PCT No.: PCT/EP2008/052205
§ 371 (c)(1),
(2), (4) Date: Aug. 23, 2010

(87) PCT Pub. No.: WO2009/103348
PCT Pub. Date: Aug. 27, 2009

(65) Prior Publication Data
US 2011/0001563 A1    Jan. 6, 2011

(51) Int. Cl.
*H04B 1/06*    (2006.01)
(52) U.S. Cl.
USPC ............... 455/234.1; 455/232.1; 455/240.1; 455/245.1; 455/249.1; 455/250.1
(58) Field of Classification Search
None
See application file for complete search history.

(56) References Cited

U.S. PATENT DOCUMENTS

| 4,334,185 | A | * | 6/1982 | Turney et al. | 323/280 |
| 4,560,949 | A | * | 12/1985 | Young | 330/284 |
| 4,574,249 | A | * | 3/1986 | Williams | 330/59 |
| 5,212,700 | A | * | 5/1993 | Okita | 372/38.07 |
| 6,060,935 | A | * | 5/2000 | Shulman | 327/345 |
| 2008/0102760 | A1 | * | 5/2008 | McConnell et al. | 455/73 |

OTHER PUBLICATIONS

Jim Stiles, Channel Resistance for Small VDS, Oct. 19, 2004, The University of Kansas, Dept. of EECS.*

* cited by examiner

*Primary Examiner* — Fayyaz Alam
*Assistant Examiner* — Mohammed Rachedine

(57) ABSTRACT

Automatic Gain Control AGC circuit comprising a PIN-diode attenuator having an input and an output and a control circuit connected to the attenuator so as to read a signal at the attenuator output. The control circuit is configured to supply a feedback control signal to the attenuator based on an error signal between the signal read at the attenuator output and a reference signal, so as to modulate an attenuation level of said attenuator and maintain a substantially constant power level at the attenuator output. The control circuit particularly comprises at least a resistor and a capacitor which define a time constant of the AGC circuit, so that the AGC circuit features a main pole depending on such time constant and on a voltage of the feedback control signal. The control circuit also comprises a variable gain block, which receives the feedback control signal and which is configured to modulate the main pole proportionally to a variable gain (G) of the gain block. Such gain (G) is varied substantially inversely to the feedback control signal voltage.

23 Claims, 12 Drawing Sheets

PIN-DIODE LINEARIZED AUTOMATIC GAIN CONTROL CIRCUITS

TECHNICAL FIELD

The present invention relates to PIN diode attenuator circuits for the receiving front end of communication devices. More particularly, the invention is adapted for Automatic Gain Control (AGC) and Radio Frequency (RF) leveling circuits, as well as for applications in the receiver front-end of broadband communication devices, such as Microwave Radio Link equipment, cable or optical-fiber TV or wireless CDMA.

BACKGROUND

PIN diode attenuator circuits are used extensively in AGC and RF leveling circuits. Typical applications are found in the receiver front-end of broadband communication devices such as Microwave Radio Link equipment, cable or optical-fiber TV, wireless CDMA, etc.

The PIN diode attenuators are well known in the art and may take many forms, ranging from a simple series or shunt mounted diode acting as a lossy reflective switch, to a more complex structure that maintains a constant matched input impedance across the full dynamic range of the attenuator.

In front-end AGC circuits, PIN diode attenuators are extensively employed in conjunction with a control feedback architecture to assure a constant power level at the output of the circuitry.

Although there are other known methods for providing AGC functions, the PIN diode approach generally results in lower power drain, less frequency pulling, lower RF signal distortion and is also less expensive.

A popular attenuator design utilized over a wide frequency range is the Pi (or π) network topology. Benefits of such design are broadband constant impedance and wide dynamic input power range, besides being a relatively inexpensive solution. The PIN diode is used as a current-controlled resistance component in the Pi network providing a variable and controlled RF attenuator.

A typical AGC configuration, based upon PIN-diode attenuator, is shown in FIGS. 1 and 2.

The attenuator 1 comprises three PIN diodes D1, D2, D3 in a Pi topology, and the attenuation level can be changed by a modulation of the forward current of the diodes. The control feedback is easily performed by using an integrator stage 2 that drives the attenuation level as a function of an output power error signal 3. The output power error signal 3 can be obtained by using a directional coupler 4 at the RF output of the attenuator 1 and a power detector 5 connected to the directional coupler 4, in order to generate a power detection signal 6 which is compared to a reference 7 through a comparator 8.

Modulation of the attenuator control signal is commonly performed by driving a BJT transistor stage acting as a simple voltage to current converter.

The main disadvantage of the existing solutions is the strong dependence, for a typical AGC circuit based upon PIN diode attenuator, of the control loop bandwidth versus the input power level. This is due to the intrinsic characteristic of the diode resistance, which varies inversely to its forward current.

In applications where a wide input power range is requested, the control bandwidth spread values could span over more than a decade.

In order to provide an example of such bandwidth spread, reference is made to FIG. 2, which shows a known front-end PIN diode AGC circuit 10 particularly for a high capacity QPSK-QAM microwave radio link modem. Such circuit 10 is a practical implementation of the block diagram of FIG. 1.

The AGC circuit 10 comprises an RF input 11, for instance in the form of a coaxial connector, which is adapted to receive signals over a wide frequency band with a wide power level spread, e.g. within 25-30 dB. The input impedance is approximately 50 ohms.

The selected signal at the input 11 is coupled to a Pi attenuator 1. In particular, the RF input 11 is coupled via a capacitor C1 to the anode of the PIN diode D2, whose anode is connected to the cathode of the PIN diode D1. The cathode of D2, instead, is connected to the cathode of the PIN diode D3, so that diodes D1, D2 and D3 form a known Pi attenuator.

The anode and cathode of PIN diode D2 are respectively connected to ground by means of resistors R1 and R4. The anodes of D1 and D3 are polarized by resistors R2 and R3, respectively, to a bias point BP. Bias point BP is also shunted to ground by a resistor R5 and is connected, through a resistor R6, to the collector of a modulation transistor Q1 acting as modulator of the attenuator control signal and as a voltage to current converter.

The transistor Q1 may be a BJT transistor. The collector of Q1 is biased via R7 to a power supply Vcc, while the emitter of transistor Q1 is coupled to the junction between capacitor C1 and the anode of D2 by means of a choke L1.

The base of Q1, instead, is connected to the output of the integrator stage 2. As a consequence, the voltage on the base of transistor Q1 allows to modulate the RF attenuation by means of the PIN diode attenuator 1.

The AGC circuit 10 further comprises an RF output 12, which is connected to the output of the Pi attenuator 1. The directional coupler 4 is provided at the RF output 12 for dropping the RF output signal and forwarding it as a feedback signal to the RF power detector 5, which is a known device configured to supply an output voltage proportional to its power input.

The signal from the power detector 5, in known AGC circuits, is input through a resistor R9 to the integrator stage 2, which comprises inverting circuitry. In particular, the integrator stage 2 includes an operational amplifier 13 having a reference voltage source Vref at its non-inverting input and a capacitor C5 connecting the output to the inverting input. An integrator resistor R9 connects the power detector output to the inverting input of the operational amplifier 13.

The typical frequency bandwidth of a receiver front-end PIN-diode AGC circuit such as the circuit of FIG. 2 is about few hundreds kilohertz when employed in a microwave radio link.

Due to the physical law governing the resistance channel of a PIN diode versus its forward current Id, the dependence of the AGC bandwidth against the AGC attenuation level is strongly variable. In fact, with reference to FIGS. 3 and 4, the main pole that defines the frequency bandwidth of the circuit 10 is given, besides by the serial resistor R9 and the feedback capacitor C5 of the integrator stage 2, by the transfer function of the PIN diode attenuator 1.

In fact, as it is known, the channel resistance Rd of a PIN diode depends on its forward current according to the following relationship:

$$R_d \propto R_{min} + \frac{A}{I_d^B},$$

where Rmin is the minimum forward resistance whilst A and B are constant parameters to shape the real function of Rd(Id). Considering that the B value for conventional PIN diodes is around 1, the diode resistance can be considered substantially inversely proportional to its forward diode current, as shown in FIG. 3, namely $$R_d \propto \frac{1}{I_d}.$$

Referring to FIG. 2, it is noted that the attenuation transfer function (hereinafter called ATT[dB]) of the Pi network (D1, D2 and D3) and the base voltage on Q1 (called here Vd) feature the same relationship between Rd and Id, namely $$ATT[dB] \propto \frac{1}{V_d}.$$

Considering that the time constant of the integrator 2 is $\tau = R_9 \cdot C_5$ and is set to be lower than the other time constants present in the circuit 10, it can be shown that the main pole of the conventional circuit of FIG. 1 is given by the integrator parameters and by the attenuation control voltage Vd which is fed back to the attenuator. More precisely, the circuit bandwidth at −3 dB, hereinafter called $BW_{-3dB}$, can be found to be $$BW_{-3\,dB} \propto \frac{1}{R_9 \cdot C_5 \cdot V_d} \quad [1]$$

Due to the $BW_{-3dB}$ dependency on Vd, the known AGC circuit bandwidth versus the attenuation level exhibits a typical trend as the one shown in FIG. 4, which reports a measured behavior of the known AGC front-end circuit 10 of FIG. 2.

As it is noted, the bandwidth spread results more than 100-120% around the mean value, over an attenuation range of 25 dB.

This behavior may not be acceptable in systems, such as Microwave Radio Link applications, where the receiver front-end AGC response should be as linear as possible when changing the input power level.

In radio links systems the above problem causes low performance in terms of flat fading tolerance, especially at low attenuation level of the PIN diodes network.

Some drawbacks are also present when dynamic modulation features are implemented in the equipment. In other words, fast enough variations of the receiver input power cause faults and errors of the radio link.

In order to solve this drawback it is often needed to use a plurality of AGC stages arranged in a cascade, for achieving an acceptably wide input power range while keeping the frequency response as flat as possible. Unfortunately, these types of workarounds, based on multiple cascaded AGC stages, are quite expensive, are often subject to stability problems in the regions where the control ranges overlap and are difficult to integrate in a single chip.

Another possibility for partially overcoming the above drawback may be to apply a strong limitation on the AGC circuit in term of input power range, but this solution is not acceptable especially in wireless applications, because this would affect the receiver input flexibility.

SUMMARY

It is an object of the invention to obviate at least some of the above drawbacks and provide an improved circuit and method particularly suitable for receiver front-ends of broadband communications devices.

This object and other objects which will become better apparent hereinafter are solved by an Automatic Gain Control AGC circuit comprising a PIN-diode attenuator, having an input and an output, and a control circuit connected to the attenuator so as to read a signal at the attenuator output. The control circuit is configured to supply a feedback control signal to the attenuator based on an error signal between the signal read at the attenuator output and a reference signal, so as to modulate an attenuation level of the attenuator and maintain a substantially constant power level at the attenuator output. The control circuit particularly comprises at least a resistor and a capacitor which define a time constant of the AGC circuit, so that the AGC circuit features a main pole depending on such time constant and on a voltage of the feedback control signal, The AGC circuit is characterized in that the control circuit comprises a variable gain block, which receives the feedback control signal and which is configured to modulate the main pole proportionally to a variable gain (G) of the gain block. Such gain (G) is varied substantially inversely to the feedback control signal voltage.

The control circuit may comprise an integrator stage for integrating the error signal, with the feedback control signal which is output by the integrator stage. The integrator stage may comprise an integrator operational amplifier having an output, a non-inverting input connected to a first reference voltage source and an inverting input connected to an integrator resistor carrying the signal read at the attenuator output.

A feedback capacitive arm may connect the integrator output to a junction point between the integrator resistor and the inverting input of the operational amplifier. The feedback capacitive arm includes an integrator capacitor and the gain block. The resistance of the integrator resistor and the capacitance of the integrator capacitor define the time constant.

The gain block may comprise a gain element featuring the gain (G) and a gain variation element for varying the gain (G). The gain variation element is preferably connected to an input of the gain element and is driven by the feedback control signal of the integrator stage.

The gain element may particularly comprise an operational amplifier in a non-inverting amplification configuration, while the gain variation element is a variable resistor driven by the feedback control signal and connected to the inverting input of the operational amplifier of the gain element.

The variable resistor may be a JFET transistor biased to work in a resistance-region. The gate terminal of the JFET transistor may be connected to the output of the integrator operational amplifier, so that the voltage applied to the gate of the JFET transistor performs the gain control of the gain element.

The JFET transistor may be a p-channel transistor, in which the source terminal is connected to the inverting input of the operational amplifier of the gain element, while the output of the operational amplifier of the gain element is connected to the inverting input of the operational amplifier of the gain element by means of a feedback resistor. The output of the operational amplifier of the integrator can be also fed back to the gain block through a resistor stage configured so that the feedback control signal voltage output by the integrator is reduced by a predetermined amount.

The gate terminal of the JFET transistor is preferably connected to the output of the integrator operational amplifier by means of a low-pass filter.

The AGC circuit may advantageously comprise an adjustment dynamic block for connecting the gate terminal of the JFET transistor to the output of the integrator operational amplifier, so as to drive the JFET transistor by means of the feedback signal which is input to the adjustment dynamic block. Such adjustment dynamic block may comprise an adjustment operational amplifier in differential configuration, in which the non-inverting input of the adjustment operational amplifier is connected to the output of the integrator operational amplifier, and the inverting input of the adjustment operational amplifier is connected to a second reference voltage source.

The PIN-diode attenuator may be a Pi attenuator, and may also comprise a modulation transistor connected to the output of the integrator stage, for modulating the feedback control signal supplied to the PIN-diode attenuator.

A microwave radio link system comprising at least one microwave transmitter and at least one microwave receiver adapted to receive microwave radio signals from the microwave transmitter may be also provided according to a second aspect of the invention, in which the microwave receiver comprises, as a front-end stage, the AGC circuit according to the foregoing. As a consequence, the transmitter may be set to transmit over a wide range of power levels without the receiver be subject to non-linearities.

According to another aspect of the invention, a method for a receiver including an Automatic Gain Control circuit having an attenuator and a control circuit is provided. In the method, the attenuator receives an input signal and generates an output signal based on the attenuator input signal. Then, the control circuit determines an error signal based on a comparison between the attenuator output signal and a reference signal. The control circuit generates a feedback control signal based on the error signal, with the error signal divided by a time constant: such time constant is chosen so as to define, together with the feedback control signal voltage, the main pole of the AGC circuit. The control circuit finally supplies the feedback control signal to the attenuator, so as to modulate an attenuation level of the attenuator and maintain a substantially constant power level at the attenuator output.

The method is characterized in that the generation of a feedback control signal by the control circuit includes a modulation of the main pole by a variable gain. Such gain is varied substantially inversely to the feedback control signal voltage.

Advantageously, the modulation of the main pole is obtained by multiplying the time constant by said variable gain.

Preferably, the generation of the feedback control signal by the control circuit comprises an integration operation of the error signal, and the time constant defined above is an integration time constant.

For determining the error signal, the attenuator output signal may be read, the power of such attenuator output signal may be detected and a corresponding attenuator output power signal voltage may be generated. Then, a difference between the output power signal voltage and a reference voltage of the reference signal may be determined, so as to generate the error signal.

The integration operation at the control circuit may comprise the provision of an operational amplifier having an inverting input, a non-inverting input and an output for supplying the feedback control signal to the attenuator. The error signal may be supplied to the inverting input, while the reference signal may be supplied to the non-inverting input of the operational amplifier.

The modulation of the main pole may comprise the step of feeding back to the inverting input of the operational amplifier the signal at the operational amplifier output amplified by the variable gain. The modulation of the main pole may accordingly follow the steps of reading the feedback control signal voltage at the operational amplifier output and varying the variable gain inversely to the feedback control signal voltage.

With the AGC circuit according to the invention it is possible to compensate for the intrinsic non-linear behavior of the AGC control loop over the input power level. The frequency response of the AGC control loop is made relatively flat and independent of the input power level, over a wide range of signal frequencies and AGC levels.

Moreover, the performance in terms of flat fading robustness of a receiver front-end that uses PIN diode attenuators is increased by means of the invention, particularly in the field of microwave radio links.

A greater flexibility is also achieved particularly in the field of microwave radio link equipment, by enabling adoption of complex dynamic modulation techniques.

Another advantage of the invention is to reduce complexity and cost of the receiver AGC circuit by limiting the number of AGC stages, and to make possible an implementation in a integrated circuit (IC) as, for instance, in a single chip integrated RF/IF Transceiver.

BRIEF DESCRIPTION OF THE DRAWINGS

Further characteristics and advantages of the invention will become better apparent from the detailed description of particular but not exclusive embodiments, illustrated by way of non-limiting examples in the accompanying drawings, wherein.

DETAILED DESCRIPTION

In the description, same reference numbers or symbols will correspond to identical features or elements, unless otherwise specified. Moreover, the symbols used for indicating resistors, capacitors and inductors will also represent the corresponding values of resistance, capacitance and inductance, respectively.

In order to avoid the large bandwidth spread discussed above, in an AGC circuit 20 according to the invention the integrator stage 22 is adjusted to obtain a substantially linear frequency response.

Figure 1:
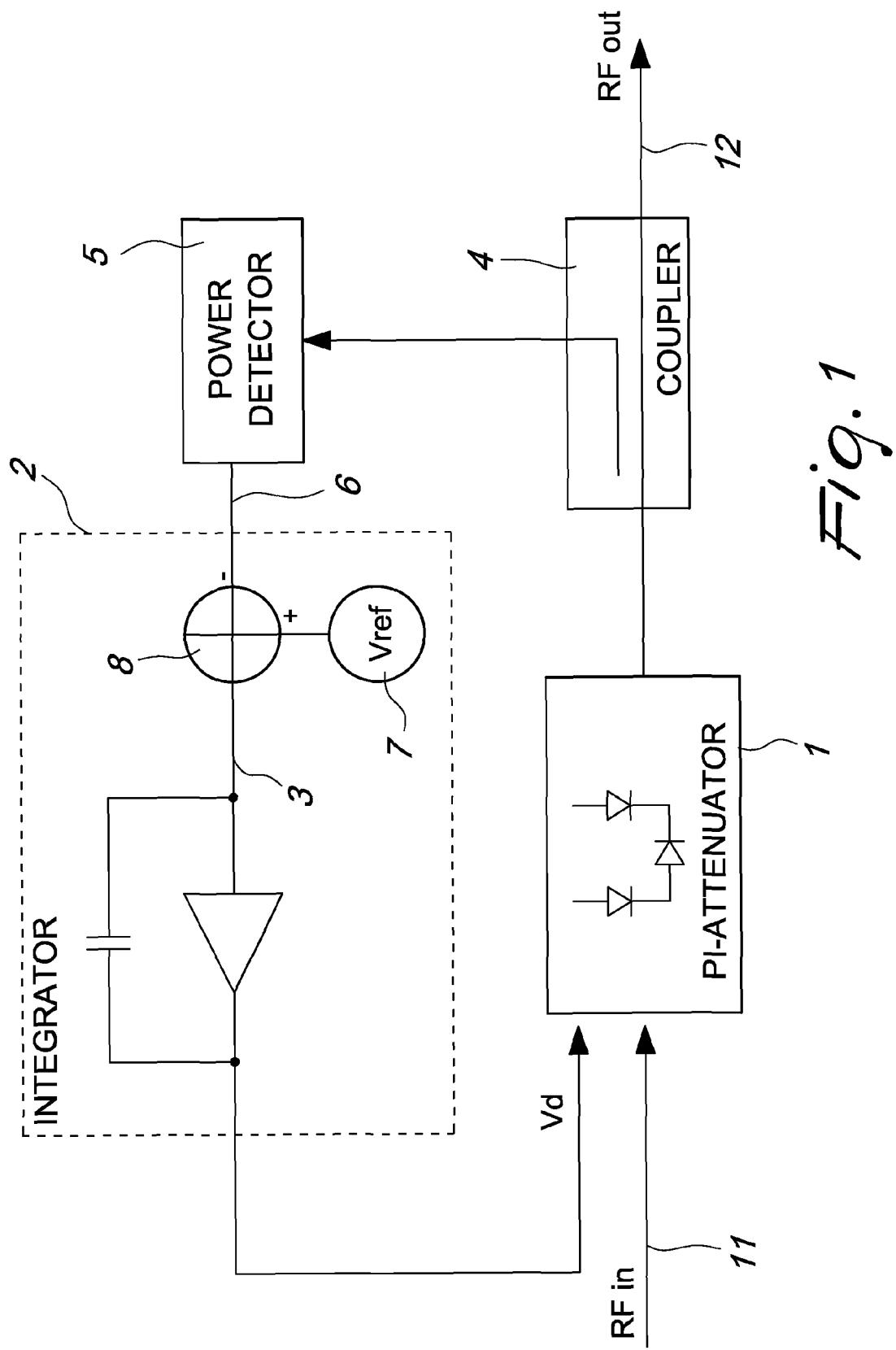
FIG. 1 is a block diagram of a prior art front-end AGC circuit based on PIN diodes.
Figure 2:
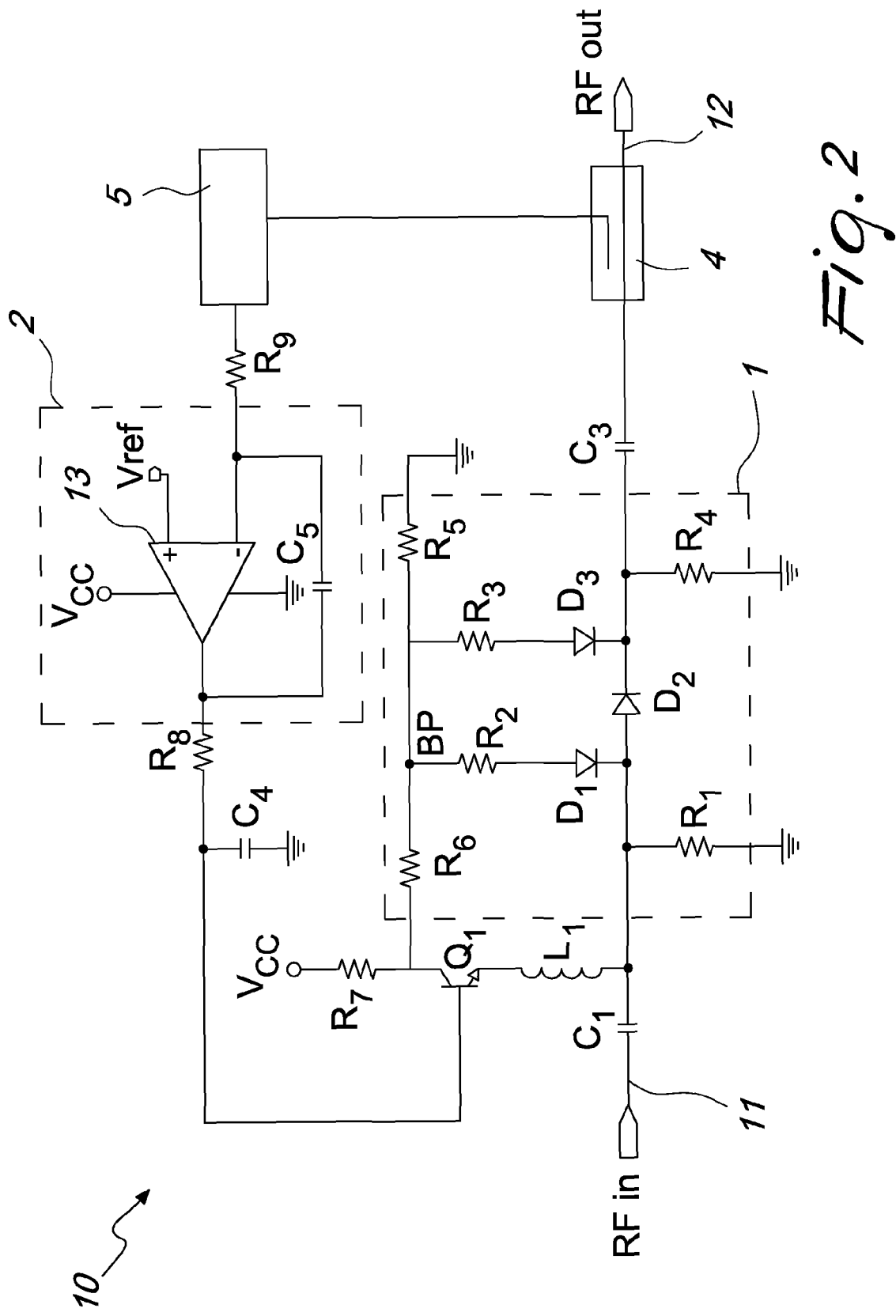
FIG. 2 is a schematic circuit of an implementation of front-end AGC circuit of FIG. 1.
Figure 3:
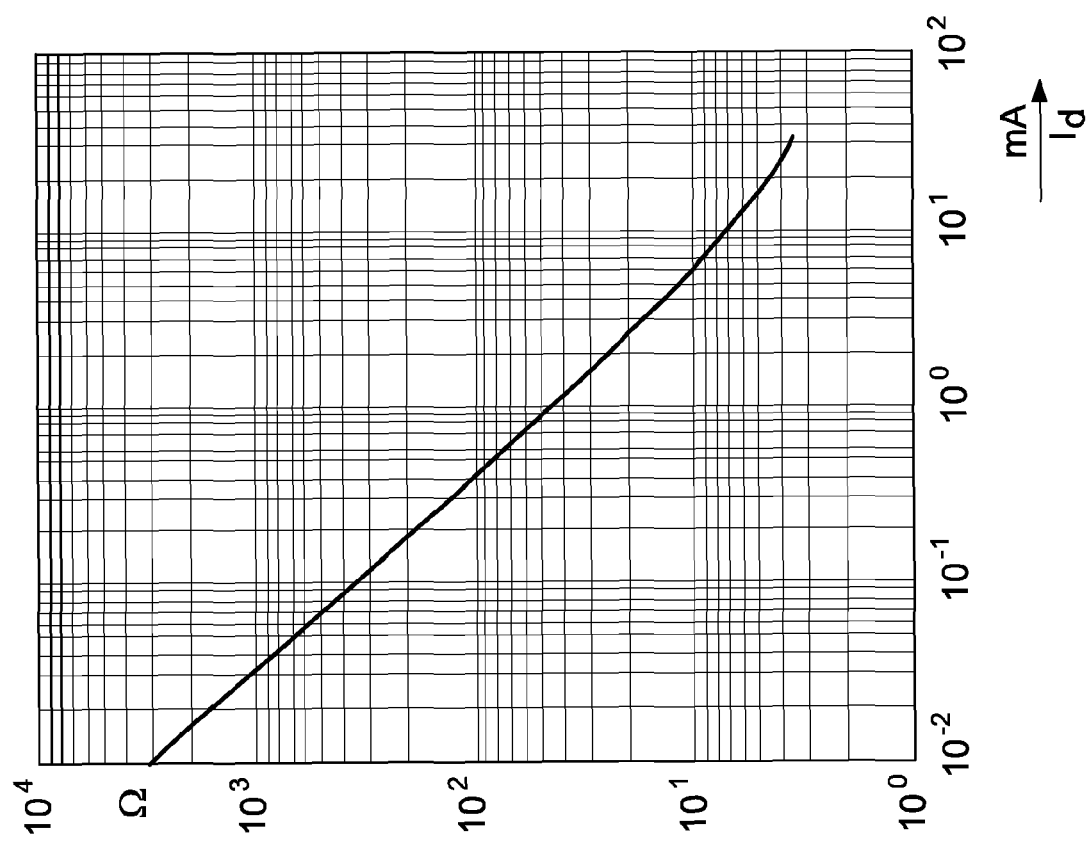
FIG. 3 shows a typical behavior of the PIN diode forward resistance Rd versus the PIN diode forward current Id.
Figure 5:
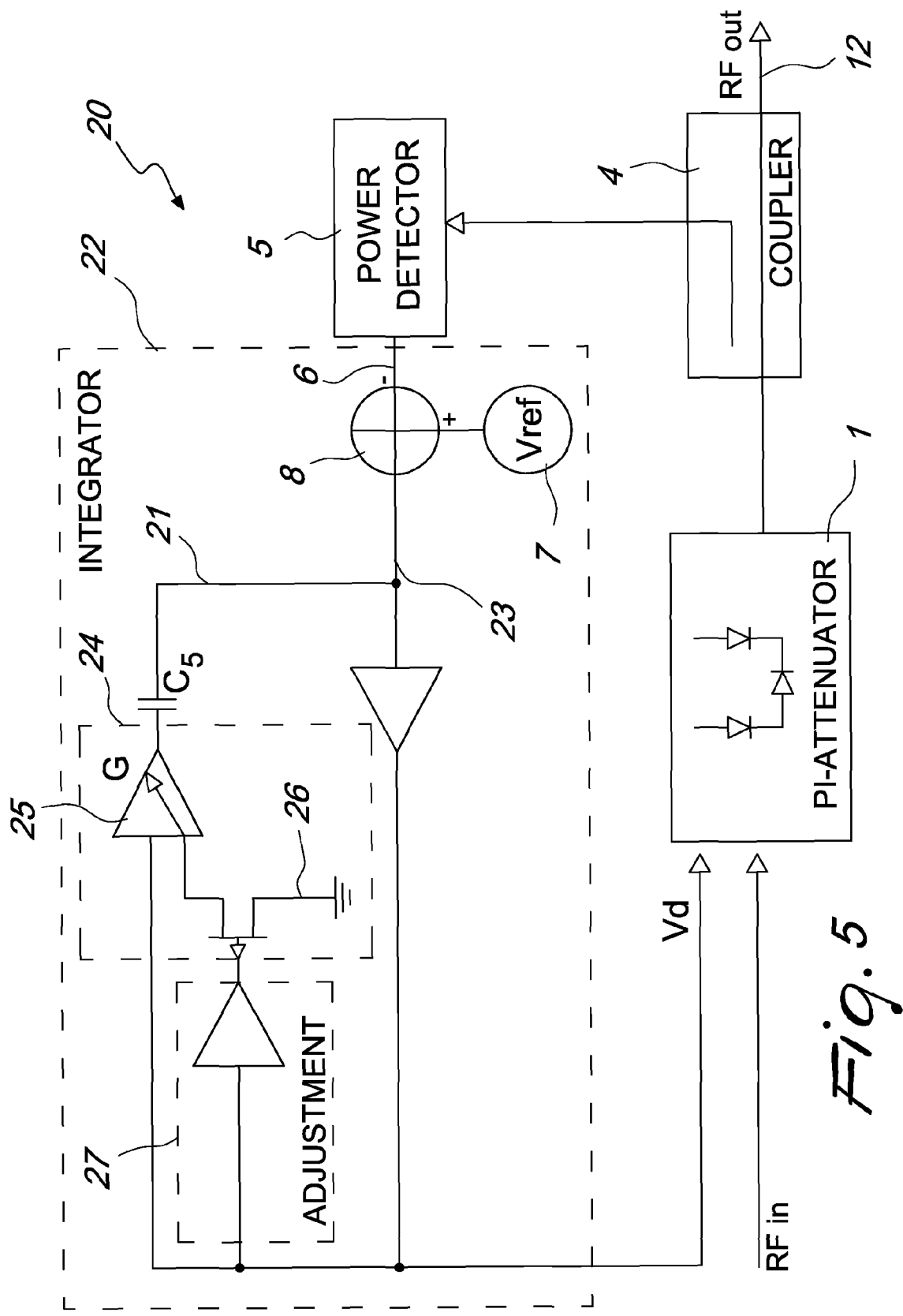
FIG. 5 is a block diagram of a front-end PIN-diode AGC circuit according to a first embodiment of the invention.

Particularly, referring to FIG. 5, the main pole of the AGC circuit is modulated with a feedback gain G at the integrator stage, in particular at the feedback arm of the integrator, so that the frequency response of the AGC circuit of FIG. 1 is substantially linearized. The gain is variable with the feedback control signal voltage, preferably according to a relationship of inverse proportionality.

It is noted that the expression "main pole" used herein has the conventional meaning: it is the upper pole which defines the bandwidth of the circuit, i.e. which defines the upper cutoff frequency.

Figure 11:
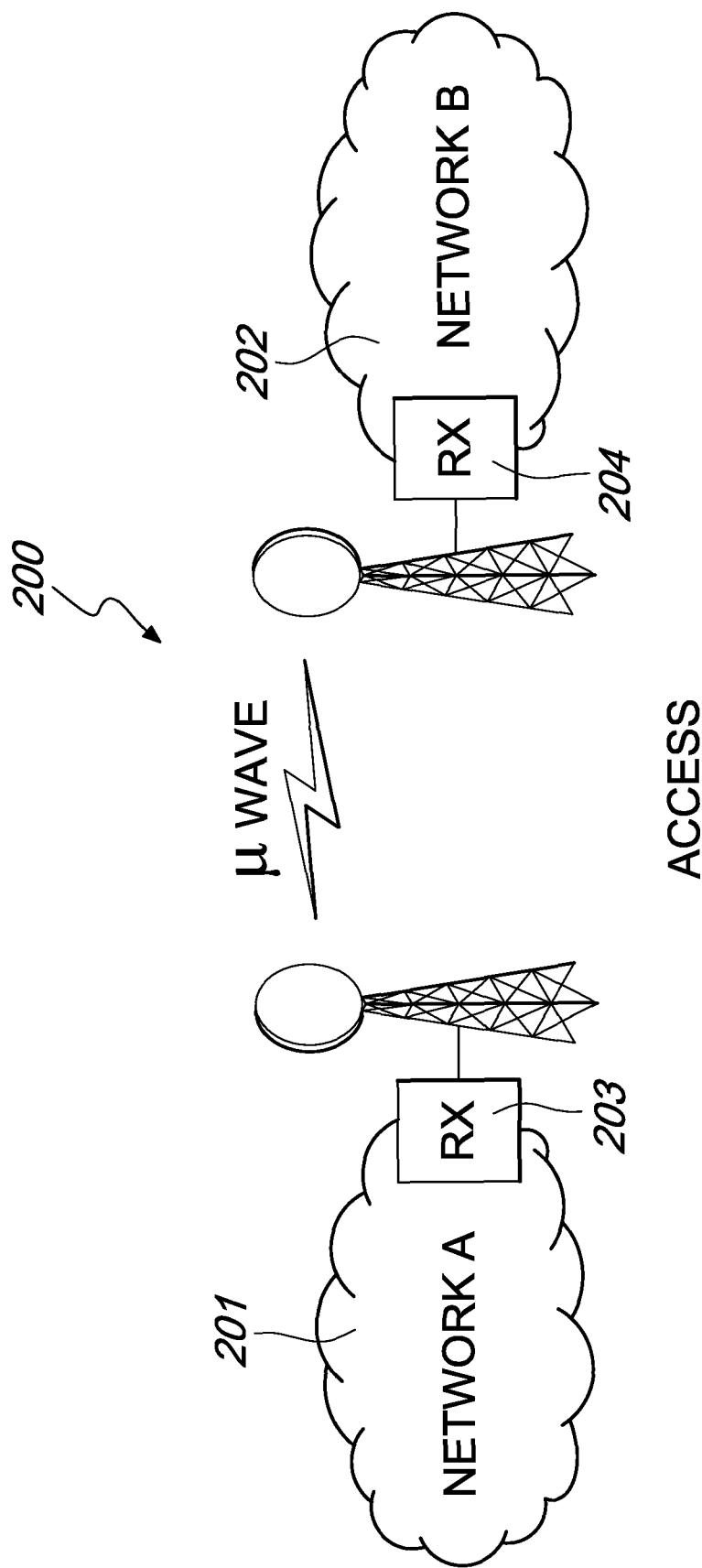
FIG. 11 shows a possible radio communications system incorporating the invention.

The AGC circuit according to the invention may be used in the receiver front-end of broadband communications devices. For instance, with reference to FIG. 11, the AGC circuit may be provided at any receiver front-end 203, 204 of a microwave link 200 between two networks, of the same or different kind, such as a UMTS communication network 201 and a SDH/SONET network 202. The receiver front-end may further comprise suitable equipment for lowering the frequency of the received microwave radio signals before providing the received signals to the AGC circuit.

The AGC circuit 20 according to the a first embodiment of the invention comprises a PIN diode attenuator 1, which preferably includes PIN diodes in a Pi configuration, but may alternatively include PIN diodes in a T configuration, or any number or topology of PIN diodes.

The attenuation level provided by the attenuator 1 can be changed by a modulation of the forward current of the diodes, through a AGC feedback control signal voltage Vd. The control feedback is provided by using a control circuit, which particularly comprises an integrator stage 22 that drives the attenuation level as a function of an output power error signal 23. The output power error signal 23 can be obtained as in the prior art, e.g. by using the directional coupler 4 at the RF output 12 of the attenuator 1 and the power detector 5 connected to the directional coupler 4, in order to generate the power detection signal 6 which is compared to the reference 7 through the comparator 8.

Modulation of the attenuator control signal may be performed by driving a BJT transistor stage Q1 acting as a voltage to current converter.

According to the invention, the integrator feedback signal is amplified, by a gain G, in order to provide a modulation of the main pole of the AGC circuit which is proportional to the gain G itself and which is chosen so as to compensate the variations of the AGC feedback control signal. In particular, in the feedback capacitive arm 21 of the integrator stage 22, a variable gain block 24 is provided, which includes a gain element 25 and a gain variation element 26, which is connected in an input of the gain element 25 and is driven by the feedback control signal of the integrator. The gain element 25 and the gain variation element 26 may consist of an operational amplifier in a non-inverting amplification configuration comprising a variable resistor driven by the feedback control signal from the integrator.

Optionally, an adjustment dynamic block 27 could be connected to the gain variation element 26 so as to drive such variation element 26 by the integrator feedback signal which is input to the adjustment dynamic block 27. Depending of the performance required, the block 27 may be required to drive the control gain.

By means of the feedback gain G, it can be shown that the bandwidth of the AGC circuit 20 becomes $$BW_{-3\,dB} \propto \frac{1}{R_9 \cdot C_5 \cdot V_d} \cdot \frac{1}{G} \qquad [2]$$

As stated above, the linearization is performed by compensating variations of the feedback control signal voltage Vd with an opposite and proper gain G.

Due to the fact that the gain G impacts on the frequency bandwidth of the circuit 20 according to an inverse proportionality relationship, it follows that decreasing G linearly raises the cut-off frequency at −3 dB and vice versa.

In the preferred embodiments of the invention, the variable gain element 26 is a JFET transistor biased to work in resistance-region, while the gain element 25 is an operational amplifier set to an amplification configuration.

Figure 6:
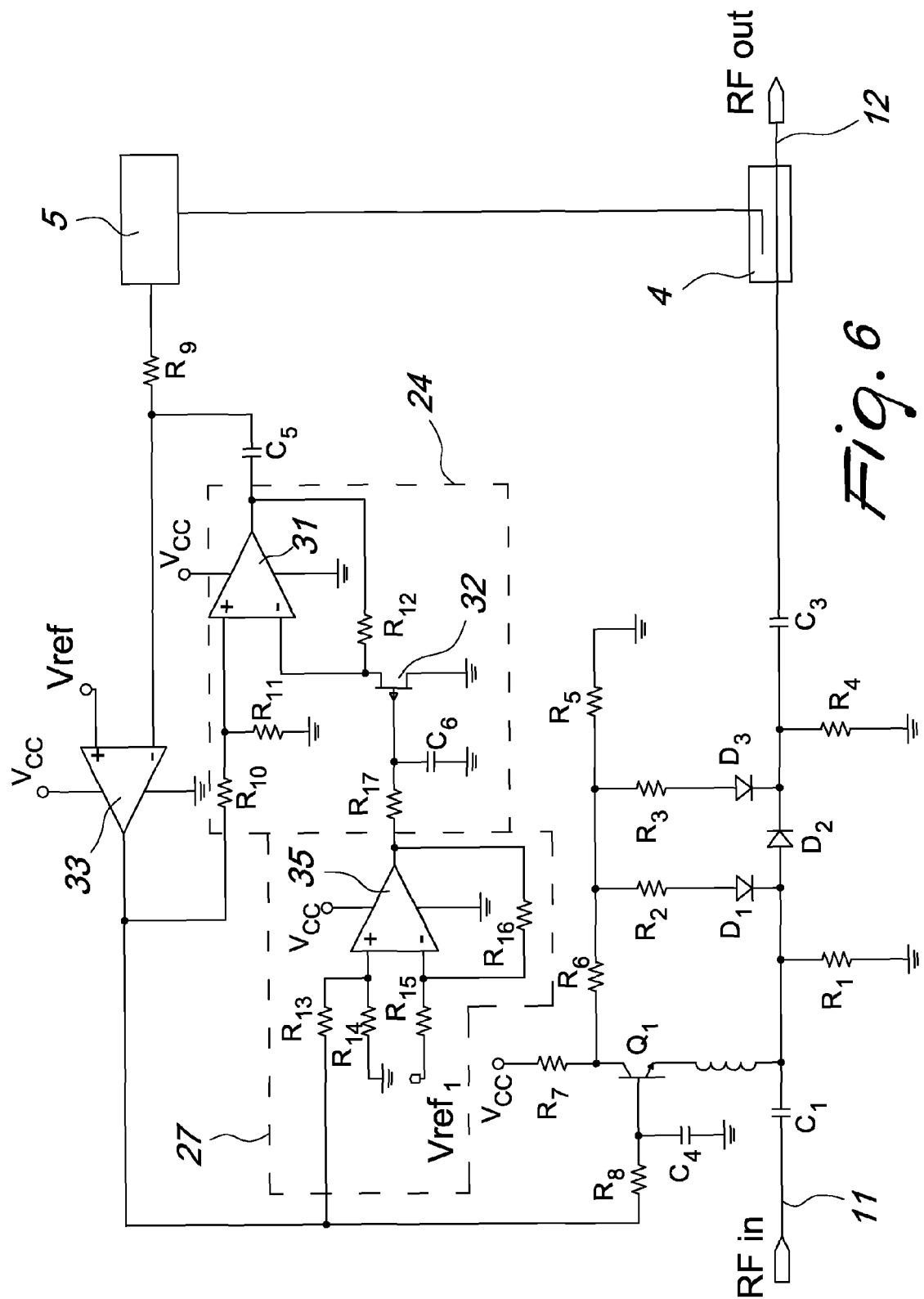
FIG. 6 is a circuit implementing the block diagram of FIG. 5.

More precisely, a JFET 32 with p-channel is used as variable resistor connected to the inverting input of an operational amplifier 31, as shown in FIG. 6. Such a configuration allows for a ratio variation gain up to 10 times. Obviously, other kinds of transistors may be used instead of the JFET 32, provided that they feature a resistance region which can be modulated by an input signal.

As shown in FIG. 6, the integrator used is based on an operational amplifier 33 whose non-inverting input is set to a properly reference voltage Vref in order to obtain the desirable power level at the output of the directional coupler 4.

The inverting input of the operational amplifier 33 is connected to the output of power detector 5 by means of the resistor R9, so as to receive the power detection signal.

The feedback arm of the integrator 22 consists of the integrator capacitor C5 and the gain block 24, and the capacitor C5 is connected to the output of the gain block 24. The output of the operational amplifier 33 is fed back to the gain block 24 through a series-connected resistor R10, which is connected to the non-inverting input of the operational amplifier 31 of the gain block 24 and is shunt to ground by a resistor R11. In this way, the integrator feedback signal is approximately divided by a predetermined amount, such as 10. This is also required in order to correctly bias the JFET 32.

The output of the gain block operational amplifier 31 is fed back to its inverting input by a resistor R12. The inverting input of the amplifier 31 is also connected to the source terminal of the p-JFET 32, whose drain terminal is grounded.

The circuit maintains the source voltage of the JFET 32 at a low level to ensure that the JFET operates in the resistive or ohmic region of its drain current versus drain-source voltage characteristic curve. In this way, the voltage applied to the gate of the JFET 32 performs the gain control of the gain element 25.

In the first embodiment of the invention, the JFET gate may be driven by the output of a further operational amplifier 35 of the adjustment dynamic block 27, which allows for the adjustment and optimization of the dynamic range of the AGC voltage control over the whole voltage range of the JFET gate.

The operational amplifier 35 is in a differential configuration, where the inverting input is connected to a second reference voltage source Vref1 through a resistor R15 and is connected to the output of the amplifier 35 through a resistor R16. The non-inverting input of amplifier 35 is connected to both the output of the integrator's amplifier 33, through a resistor R13 and to the ground, by means of resistor R14.

A low-pass filter comprising a resistor R17 and a capacitor C6 may be used to connect the output of the amplifier 35 to the gate of the JFET 32. Such low-pass filter allows to avoid unwanted instability.

The purpose of the adjustment dynamic block 27 is to optimize the dynamic voltage level between the allowed voltage range of the control signal, coming from the integrator output, over the whole gate voltage of JFET 32. The transfer function of block 27 can be obtained by the difference between Vref1 and the voltage level present on connection point of the resistor R13 and the integrator's output, if the resistances are chosen so that R13=R15 and R14=R16.

The integrator feedback control is thus obtained by shutting the output of the integrator 33 across the serial resistor R13 to the non-inverting input of amplifier 35. In this way, the main pole of the AGC circuit will become level-dependent, achieving a relatively flat frequency response over a wide attenuation range.

Figure 8:
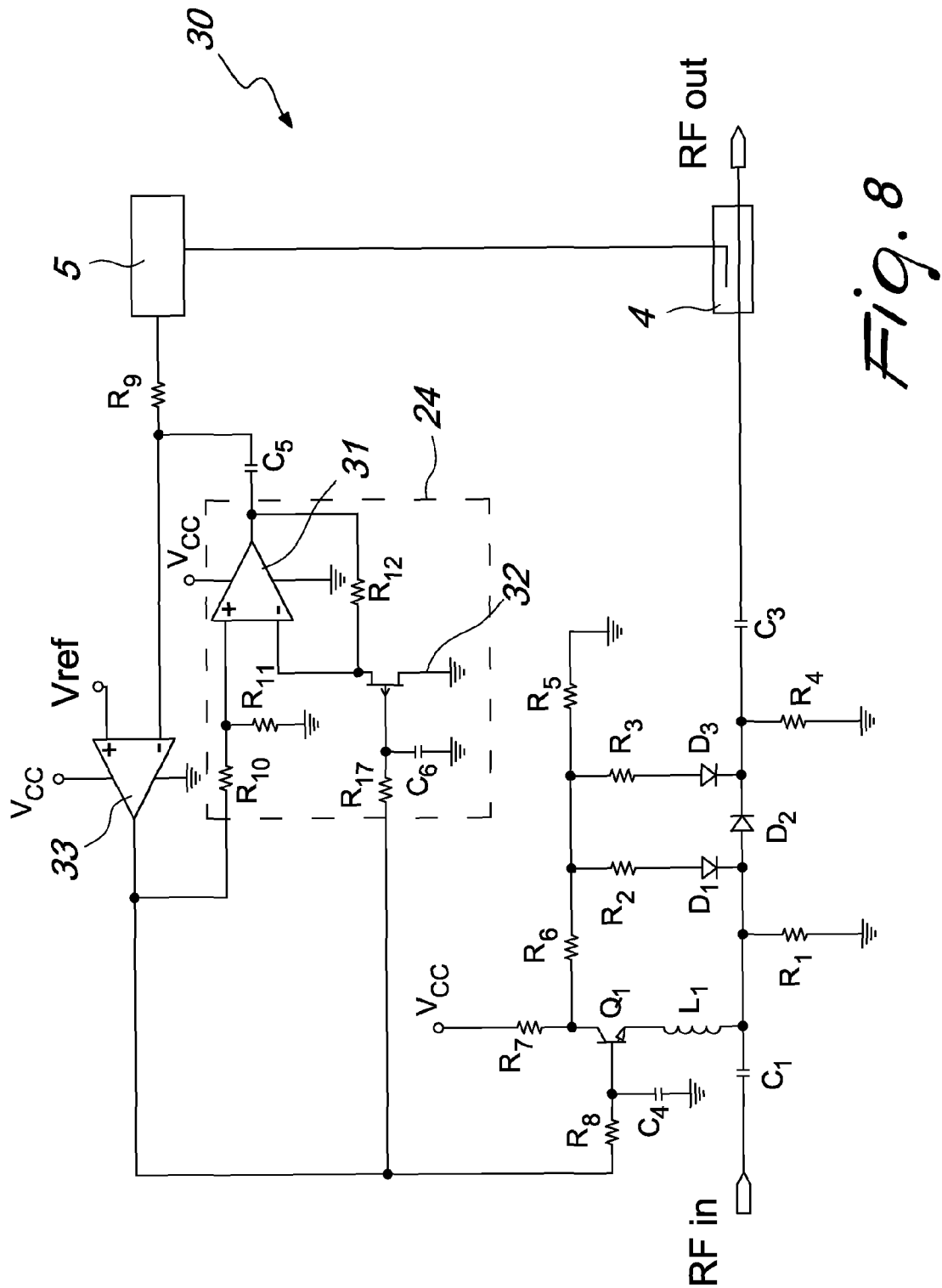
FIG. 8 is a front-end AGC circuit according to a second embodiment of the invention.

In the second embodiment of the invention, depicted in FIG. 8, the adjustment dynamic block is omitted, so that the output of the integrator 33 is directly connected to the gate of the JFET 32. In this case, the dynamic voltage range of the drive signal of the JFET gate shall be set so as to maintain the JFET in its resistor-region. Although the second embodiment, in terms of power input, is less preferable than the first embodiment, the performance of the circuit 30 is nevertheless acceptable.

In both embodiments, the AGC loopback is closed by the resistor R8 placed between the output of the integrator 33 and the base of the BJT transistor Q1, which is shunted to the ground by a capacitor C4.

The values of R8 and C4 are preferably chosen in order to obtain a low pass filter with its pole at least a decade away from the main pole of the circuit. This assures a good noise suppression performance without interfering with the frequency response of the AGC circuit.

It is noted that, in the resistor region of the JFET 32 (Vgs<VgsOFF) the channel resistance Rds of the JFET is substantially as follows:

$$R_{ds} \cong \frac{R_{dsON}}{1 - V_{gs}/V_{gsOFF}} \quad [3]$$

where RdsON is the Drain-Source ON resistance, Vgs is the Gate-Source voltage and VgsOFF is the Gate-Source cutoff voltage. As a consequence, in the block 24 the gain G is:

$$G = \frac{R_{11}}{R_{10} + R_{11}}\left(1 + \frac{R_{12}}{R_{ds}}\right). \quad [4]$$

By substituting the Rds expression [3] into the G function [4], it can be seen that the gate-source voltage of the JFET (Vgs) is linearly and proportionality modulated by the feedback control signal voltage Vd of the Pi attenuator 1. In fact, since Vgs is less than VgsOFF, Rds increases if Vgs increases and, accordingly, the gain G decreases with an increasing Vgs. Thus, with reference to relationship [2], it is possible to limit the frequency bandwidth spread due to the variable control voltage Vd, i.e. the $BW_{-3dB}$ function described in relationship [2] becomes quite constant. Thanks to the AGC circuit of FIGS. 5 and 8, the control of the integrator feedback gain is provided by the AGC control voltage itself.

Figure 7:
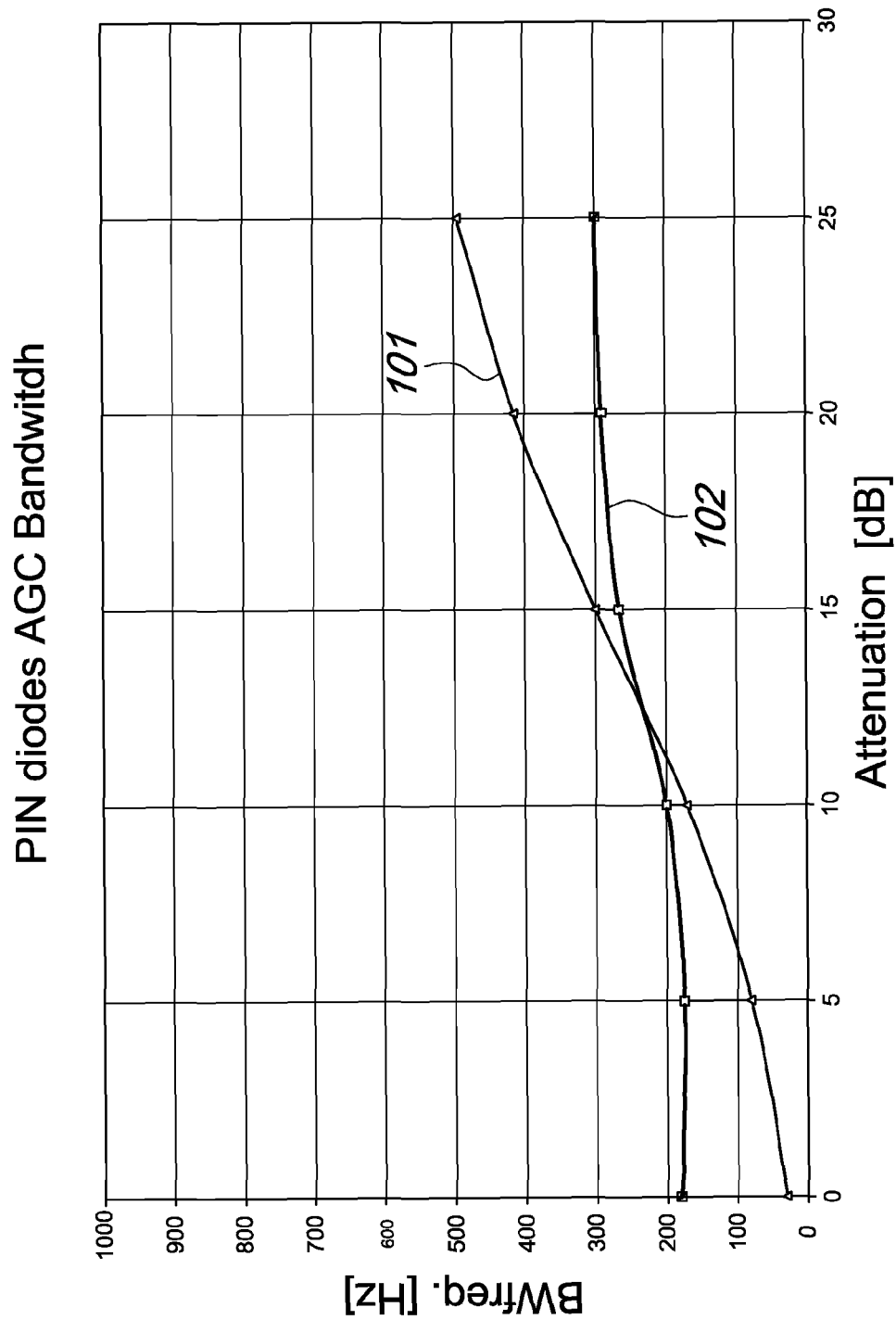
FIG. 7 plots bandwidth versus attenuation curves of the circuits of FIGS. 2 and 6.

FIG. 7 shows the bandwidth vs. attenuation curves of the prior art AGC 10 (curve 101) and of an AGC according to the invention (curve 102). As it is noted, the invention allows to achieve a frequency bandwidth spread limited to only 30% about the mean value, specifically only 180-300 Hz over an attenuation range of 25 dB.

It is also noted that the AGC circuit according to the invention does not change all RF performances of the known AGC circuit 10, such as input impedance, distortion, noise, etc.

Figure 9:
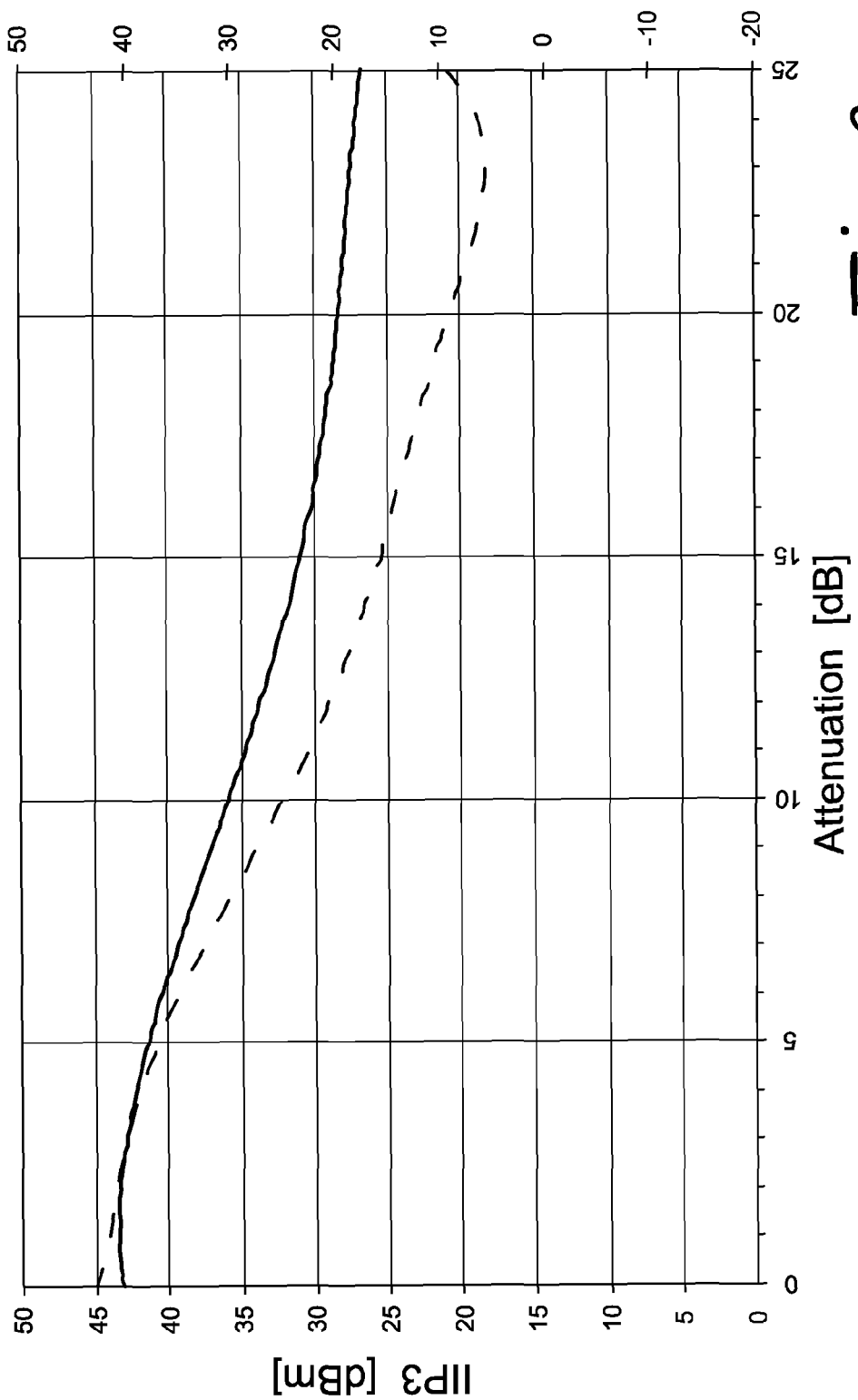
FIG. 9 shows a possible third-order-intercept-point (IP3) performance for a PIN diode AGC circuit according to the invention.
Figure 10:
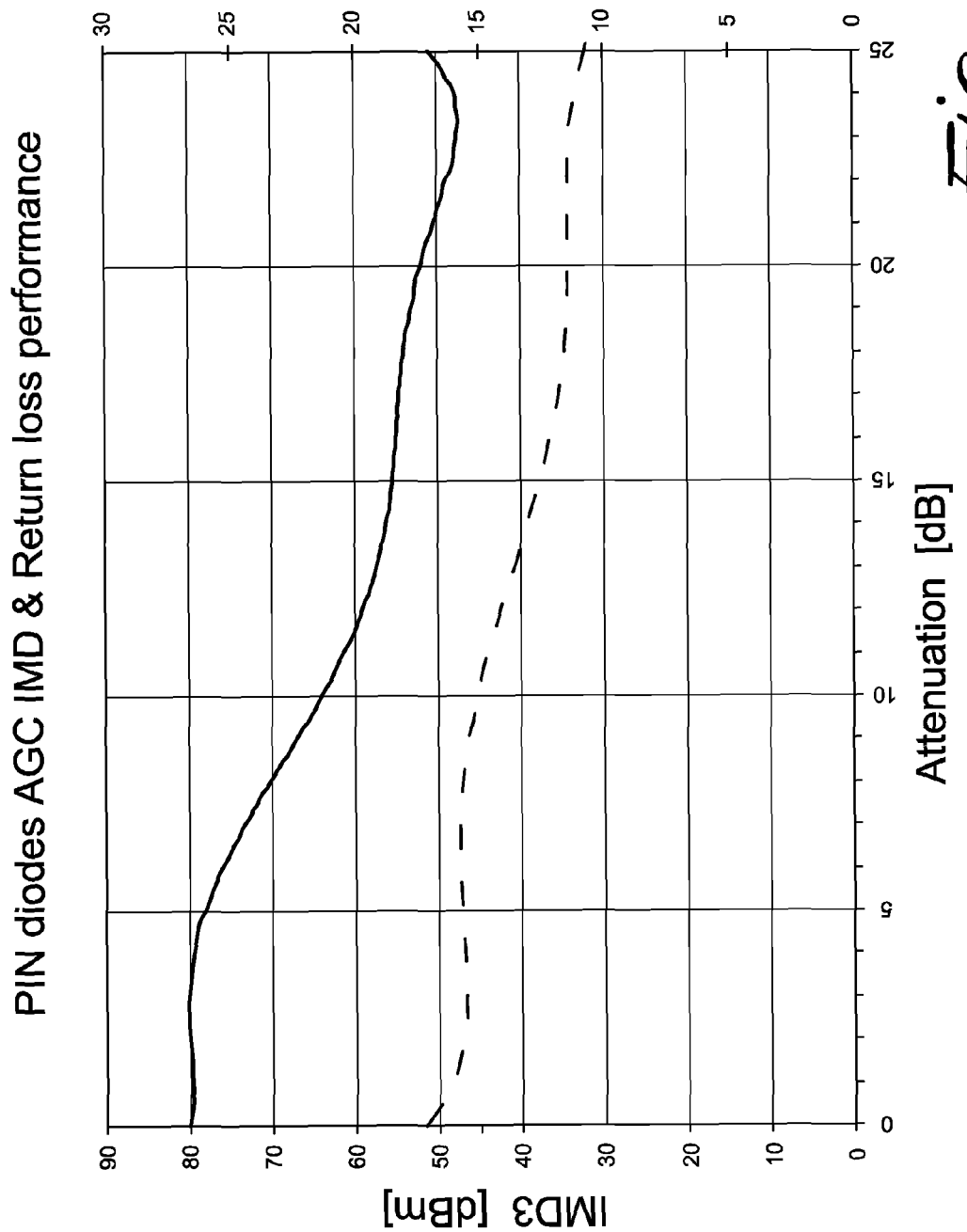
FIG. 10 shows possible intermodulation third harmonic distortion (IMD3) and return loss patterns for a PIN diode AGC according to the invention.

Typical RF behaviors of the circuit according to the invention are shown in FIGS. 9 and 10. FIG. 9 reports the third-order intercept point (IP3) performance, measured at 140 MHz: the output IP3 is represented in broken line, while the input IP3 is represented in full line. FIG. 10, with the same measures boundary conditions, shows the intermodulation distortion for the third harmonic (IMD3) and, in broken line, the return loss.

Figure 12:
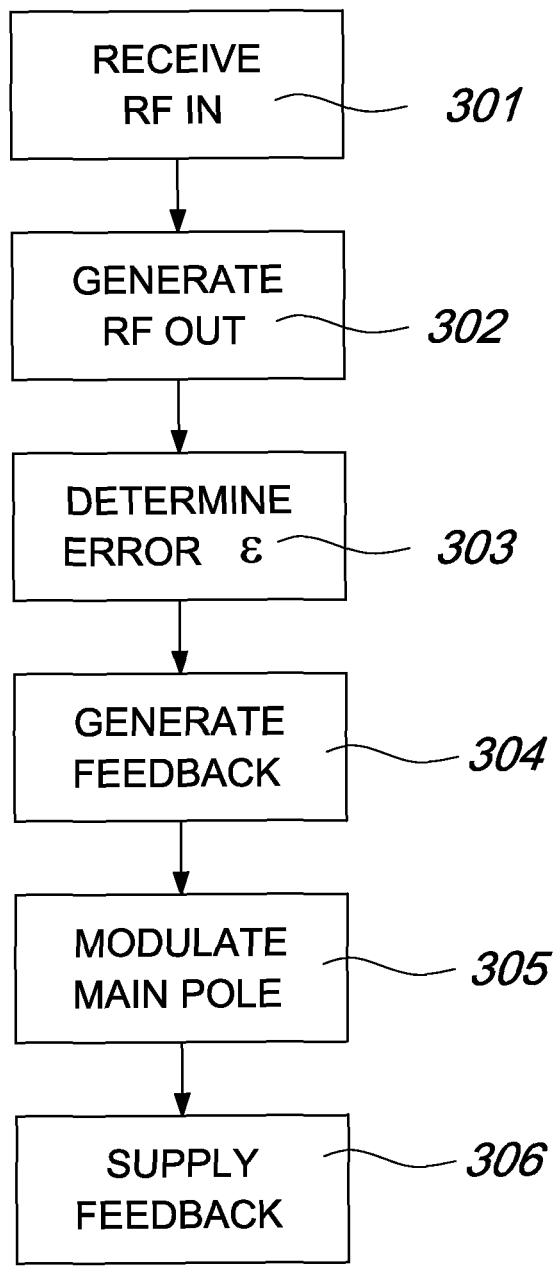
FIG. 12 shows a method according to a preferred embodiment the invention.

The operation of the circuit of FIG. 5 may be better understood with reference to the method underlying the invention. With reference to FIG. 12, a method according to a preferred embodiment of the invention comprises a step 301 in which an RF input signal is received at the attenuator input 11.

The attenuator, in step 302, produces an output signal based on the attenuator input signal: such output signal may be attenuated according to a certain level, which is modulated by the feedback control signal of the AGC circuit. The attenuator output signal is read, preferably by the power detector 5 through the directional coupler 4, so as to generate a voltage indicative of the power of the attenuator output signal which is supplied to the control circuit.

Then, in step 303, an error signal based on a comparison between the attenuator output signal and a reference signal is generated. In particular, the voltage generated by the power detector based on the attenuator output signal is compared to a reference voltage, and the difference between these two voltages defines the error signal. The error signal may be obtained through the input stage of the integrator 22, as shown in FIG. 6 or 8. Obviously, other arrangements for generating the error signal may be used.

In step 304 the control circuit generates a feedback control signal based on the error signal: in this phase, the error signal is divided by a time constant, which in the preferred embodiment of the invention is the integration time constant of an integrator. The time constant is chosen so as to define, together with the feedback control signal voltage, the main pole of the AGC circuit.

In the preferred embodiments of the invention, the feedback control signal is generated by an integrator, which may be obtained through an operational amplifier receiving the voltage generated by the power detector based on the attenuator output signal and the reference voltage at respective inputs, as shown in FIGS. 6 and 8, and comprising a capacitive feedback arm 21 having the variable gain block 24.

The variable gain block 24 provides a variable gain through which (step 305) the main pole defined by the time constant is modulated, e.g. by multiplication. The variable gain is chosen so as to vary substantially inversely proportionally to the feedback control signal voltage.

Obviously, different integration configurations may be provided in the alternative, such as a cascade of a comparator for generating the error signal and an RC filter at the output of the comparator, for providing the time constant of the AGC circuit main pole. A variable resistor may be provided in such an alternative configuration, e.g. in the RC filter, in order to obtain the modulation of the main pole according to the invention.

Finally, in step 306, the control circuit supplies the feedback control signal to the attenuator, so as to modulate an attenuation level of the attenuator and maintain a substantially constant power level at the attenuator output.

It has been shown that the invention achieves the intended aim and objects. In particular, the linearization improves the performance of a PIN diode based front-end AGC in terms of bandwidth stability. In systems where a wide range of power input levels is required, the linearized front-end AGC according to the invention guarantees a control loop bandwidth that is substantially independent of the attenuation level.

Therefore, a benefit of the invention is a great flexibility, which extends the operating region of the AGC circuit over a wider range of input signal power levels. This is obtained by exploiting the attenuation region where the too narrow bandwidths of conventional AGC circuits makes such circuits unusable.

Furthermore, the complexity of the whole receiver chain is reduced by limiting the number of AGC stages and, consequently, decreasing the overall equipment cost.

The circuits according to the invention also improve the performance of complete receiver front-ends that use an AGC circuit based on PIN-diode attenuators. The improved control loop linearity versus input power level allows better receiver performance in terms of flat fading robustness, for example in the typical application field of microwave radio links, without the need for expensive or more complex solutions. In fact, the solution allows to accept, by using only a single AGC circuit, fast variation of input power level over a wider power input range.

Always in the field microwave radio link equipment, the invention provides greater flexibility enabling the adoption of more complex dynamic modulation techniques, while retaining the straightforward implementation and low cost characteristics of the simple PIN-diode based AGC circuits. In fact, the architectures of dynamic or adaptive modulation techniques, which are currently a hot topic in radio link systems, need to maintain the total system gain as higher as possible for all modulations foreseen. This is possible by varying the power level from the modem to the radio equipment. The front-end AGC circuit allows to have a frequency bandwidth which is wide enough to follow the fast power variation of the signal coming from the modem unit, and the frequency bandwidth does not depend on the working power level.

Clearly, several modifications will be apparent to and can be readily made by the skilled in the art without departing from the scope of the present invention. Therefore, the scope of the claims shall not be limited by the illustrations or the preferred embodiments given in the description in the form of examples, but rather the claims shall encompass all of the features of patentable novelty that reside in the present invention, including all the features that would be treated as equivalents by the skilled in the art.

Where technical features mentioned in any claim are followed by reference signs, those reference signs have been included for the sole purpose of increasing the intelligibility of the claims and accordingly, such reference signs do not have any limiting effect on the interpretation of each element identified by way of example by such reference signs.

The invention claimed is:

1. An Automatic Gain Control (AGC) circuit comprising:
 a PIN-diode attenuator having an attenuator input and an attenuator output;
 a control circuit connected to the attenuator so as to read a signal at the attenuator output, the control circuit being configured to supply a feedback control signal to the attenuator based on an error signal between the signal read at the attenuator output and a reference signal, so as to modulate an attenuation level of the attenuator and maintain a substantially constant power level at the attenuator output, the control circuit comprising at least a resistor and a capacitor which define a time constant of the AGC circuit, the AGC circuit featuring a main pole depending on the time constant and on a voltage of the feedback control signal,
 wherein the control circuit further comprises:
  an integrator stage including an integrator operational amplifier configured to integrate the error signal responsive to the signal at the attenuator output and the first reference signal, and provide the feedback control signal at an integrator output; and
  a variable gain block coupled to the integrator output and including a gain element formed with a gain operational amplifier and a gain variation element formed with a junction field-effect transistor (JFET) coupled to an input of the gain operational amplifier, the variable gain block configured to receive the feedback control signal and modulate the main pole proportionally to a variable gain of the variable gain block, the variable gain being varied substantially inversely to the voltage of the feedback control signal and the JFET configured to perform gain control of the variable gain in accordance with a voltage applied to a gate terminal thereof.

2. The AGC circuit of claim 1, wherein the integrator operational amplifier includes a non-inverting input connected to a first reference voltage source providing the reference signal and an inverting input connected to the resistor carrying the signal read at the attenuator output, a feedback capacitive arm connecting the integrator output to a junction point between the resistor and the inverting input of the integrator operational amplifier, the feedback capacitive arm including the capacitor and the variable gain block, a resistance of the resistor and a capacitance of the capacitor defining the time constant.

3. The AGC circuit of claim 1, wherein the JFET is a p-channel transistor, a source terminal of the JFET being connected to an inverting input of the gain operational amplifier, an output of the gain operational amplifier being connected to the inverting input of the gain operational amplifier by means of a feedback resistor, the integrator output of the integrator operational amplifier being fed back to the variable gain block through a resistor stage configured so that the voltage of the feedback control signal by the integrator stage is reduced by a predetermined amount.

4. The AGC circuit of claim 1, wherein the gate terminal of the JFET is connected to the integrator output of the integrator operational amplifier by means of a low-pass filter.

5. The AGC circuit of claim 1, further comprising an adjustment dynamic block for connecting the gate terminal of the JFET to the integrator output of the integrator operational amplifier, so as to drive the JFET by means of the feedback control signal which is input to the adjustment dynamic block, the adjustment dynamic block comprising an adjustment operational amplifier in differential configuration, a non-inverting input of the adjustment operational amplifier being connected to the integrator output of the integrator operational amplifier, and an inverting input of the adjustment operational amplifier being connected to a second reference voltage source.

6. The AGC circuit of claim 1, wherein the attenuator is a Pi attenuator.

7. The AGC circuit of claim 1, comprising a modulation transistor connected to the integrator output of the integrator stage, the modulation transistor acting as modulator of the feedback control signal supplied to the attenuator.

8. A microwave radio link comprising at least one microwave transmitter and at least one microwave receiver adapted to receive microwave radio signals from the microwave transmitter, the link comprising, as a front-end stage, an Automatic Gain Control (AGC) circuit comprising:
- a PIN-diode attenuator having an attenuator input and an attenuator output;
- a control circuit connected to the attenuator so as to read a signal at the attenuator output, the control circuit being configured to supply a feedback control signal to the attenuator based on an error signal between the signal read at the attenuator output and a reference signal, so as to modulate an attenuation level of the attenuator and maintain a substantially constant power level at the attenuator output, the control circuit comprising at least a resistor and a capacitor which define a time constant of the AGC circuit, the AGC circuit featuring a main pole depending on the time constant and on a voltage of the feedback control signal,
the microwave radio link wherein the control circuit comprises:
- an integrator stage including an integrator operational amplifier configured to integrate the error signal responsive to the signal at the attenuator output and the first reference signal, and provide the feedback control signal at an integrator output; and
- a variable gain block coupled to the integrator output and including a gain element formed with a gain operational amplifier and a lain variation element formed with a junction field-effect transistor (JFET) coupled to an input of the gain operational amplifier, the variable gain block configured to receive the feedback control signal and modulate the main pole proportionally to a variable gain of the variable gain block, the variable gain being varied substantially inversely to the voltage of the feedback control signal and the JFET configured to perform gain control of the variable gain in accordance with a voltage applied to a gate terminal thereof.

9. The microwave radio link of claim 8, wherein the integrator operational amplifier includes a non-inverting input connected to a first reference voltage source providing the reference signal and an inverting input connected to the resistor carrying the signal read at the attenuator output, a feedback capacitive arm connecting the integrator output to a junction point between the resistor and the inverting input of the integrator operational amplifier, the feedback capacitive arm including the capacitor and the variable gain block, a resistance of the resistor and a capacitance of the capacitor defining the time constant.

10. The microwave radio link of claim 8, wherein the JFET is a p-channel transistor, a source terminal of the JFET being connected to an inverting input of the gain operational amplifier, an output of the gain operational amplifier being connected to the inverting input of the gain operational amplifier by means of a feedback resistor, the integrator output of the integrator operational amplifier being fed back to the variable gain block through a resistor stage configured so that the voltage of the feedback control signal by the integrator stage is reduced by a predetermined amount.

11. The microwave radio link of claim 8, wherein the gate terminal of the JFET is connected to the integrator output of the integrator operational amplifier by means of a low-pass filter.

12. The microwave radio link of claim 8, wherein the AGC circuit further comprises an adjustment dynamic block for connecting the gate terminal of the JFET to the integrator output of the integrator operational amplifier, so as to drive the JFET by means of the feedback control signal which is input to the adjustment dynamic block, the adjustment dynamic block comprising an adjustment operational amplifier in differential configuration, a non-inverting input of the adjustment operational amplifier being connected to the integrator output of the integrator operational amplifier, and an inverting input of the adjustment operational amplifier being connected to a second reference voltage source.

13. The microwave radio link of claim 8, wherein the attenuator of the AGC circuit is a Pi attenuator.

14. The microwave radio link of claim 8, wherein the AGC circuit comprises a modulation transistor connected to the integrator output of the integrator stage, the modulation transistor acting as modulator of the feedback control signal supplied to the attenuator.

15. An Automatic Gain Control (AGC) circuit comprising:
- a PIN-diode attenuator having an attenuator input and an attenuator output;
- a control circuit connected to the attenuator so as to read a signal at the attenuator output, the control circuit being configured to supply a feedback control signal to the attenuator based on an error signal between the signal read at the attenuator output and a reference signal, so as to modulate an attenuation level of the attenuator and maintain a substantially constant power level at the attenuator output, the control circuit comprising at least a resistor and a capacitor which define a time constant of the AGC circuit, the AGC circuit featuring a main pole depending on the time constant and on a voltage of the feedback control signal,
wherein the control circuit further comprises:
- an integrator stage including an integrator operational amplifier configured to integrate the error signal responsive to the signal at the attenuator output and the first reference signal, and provide the feedback control signal at an integrator output;
- a variable gain block coupled to the integrator output and including a gain element formed with a gain operational amplifier and a gain variation element coupled to an input of the gain operational amplifier, the variable gain block configured to receive the feedback control signal and modulate the main pole proportionally to a variable gain of the variable gain block, the variable gain being varied substantially inversely to the voltage of the feedback control signal; and
- an adjustment dynamic block including an adjustment operational amplifier having inputs coupled to the integrator output of the integrator operational amplifier and a second reference voltage source and an output coupled to the variable gain element.

16. The AGC circuit of claim 15, wherein the integrator operational amplifier includes a non-inverting input connected to a first reference voltage source providing the reference signal and an inverting input connected to the resistor carrying the signal read at the attenuator output, a feedback capacitive arm connecting the integrator output to a junction point between the resistor and the inverting input of the integrator operational amplifier, the feedback capacitive arm including the capacitor and the variable gain block, a resistance of the resistor and a capacitance of the capacitor defining the time constant.

17. The AGC circuit of claim 15, wherein the gain variation element comprises a variable resistor driven by the feedback control signal and connected to an inverting input of the gain operational amplifier.

18. The AGC circuit of claim 15, wherein the gain variation element comprises a junction field-effect transistor (JFET) biased to work in a resistance-region with a gate terminal of the JFET being connected to the integrator output of the integrator operational amplifier.

19. The AGC circuit of claim 15, wherein the gain variation element comprises a junction field-effect transistor (JFET) with a gate terminal of the JFET being connected to the integrator output of the integrator operational amplifier by means of a low-pass filter.

20. The AGC circuit of claim 15, wherein the gain variation element comprises a junction field-effect transistor (JFET) including a source terminal being connected to an inverting input of the gain operational amplifier, an output of the gain operational amplifier being connected to the inverting input of the gain operational amplifier by means of a feedback resistor, the integrator output of the integrator operational amplifier being fed back to the variable gain block through a resistor stage configured so that the voltage of the feedback control signal by the integrator stage is reduced by a predetermined amount.

21. The AGC circuit of claim 15, wherein the gain variation element comprises a junction field-effect transistor (JFET), a non-inverting input of the adjustment operational amplifier being coupled to the integrator output of the integrator operational amplifier and an inverting input of the adjustment operational amplifier being coupled to the second reference voltage source, an output of the adjustment operational amplifier being coupled to a gate terminal of the JFET so as to drive the JFET by means of the feedback control signal which is input to the adjustment dynamic block.

22. The AGC circuit of claim 15, wherein the attenuator is a Pi attenuator.

23. The AGC circuit of claim 15, comprising a modulation transistor connected to the integrator output of the integrator stage, the modulation transistor acting as modulator of the feedback control signal supplied to the attenuator.

* * * * *

UNITED STATES PATENT AND TRADEMARK OFFICE
CERTIFICATE OF CORRECTION

| | | |
|---|---|---|
| PATENT NO. | : 8,521,114 B2 | Page 1 of 1 |
| APPLICATION NO. | : 12/918913 | |
| DATED | : August 27, 2013 | |
| INVENTOR(S) | : Carugati | |

It is certified that error appears in the above-identified patent and that said Letters Patent is hereby corrected as shown below:

On the Title Page, Item (57), under "ABSTRACT", in Column 2, Line 1, delete "Automatic Gain Control AGC" and insert -- Automatic Gain Control (AGC) --, therefor.

In the Drawings

Figure 4:
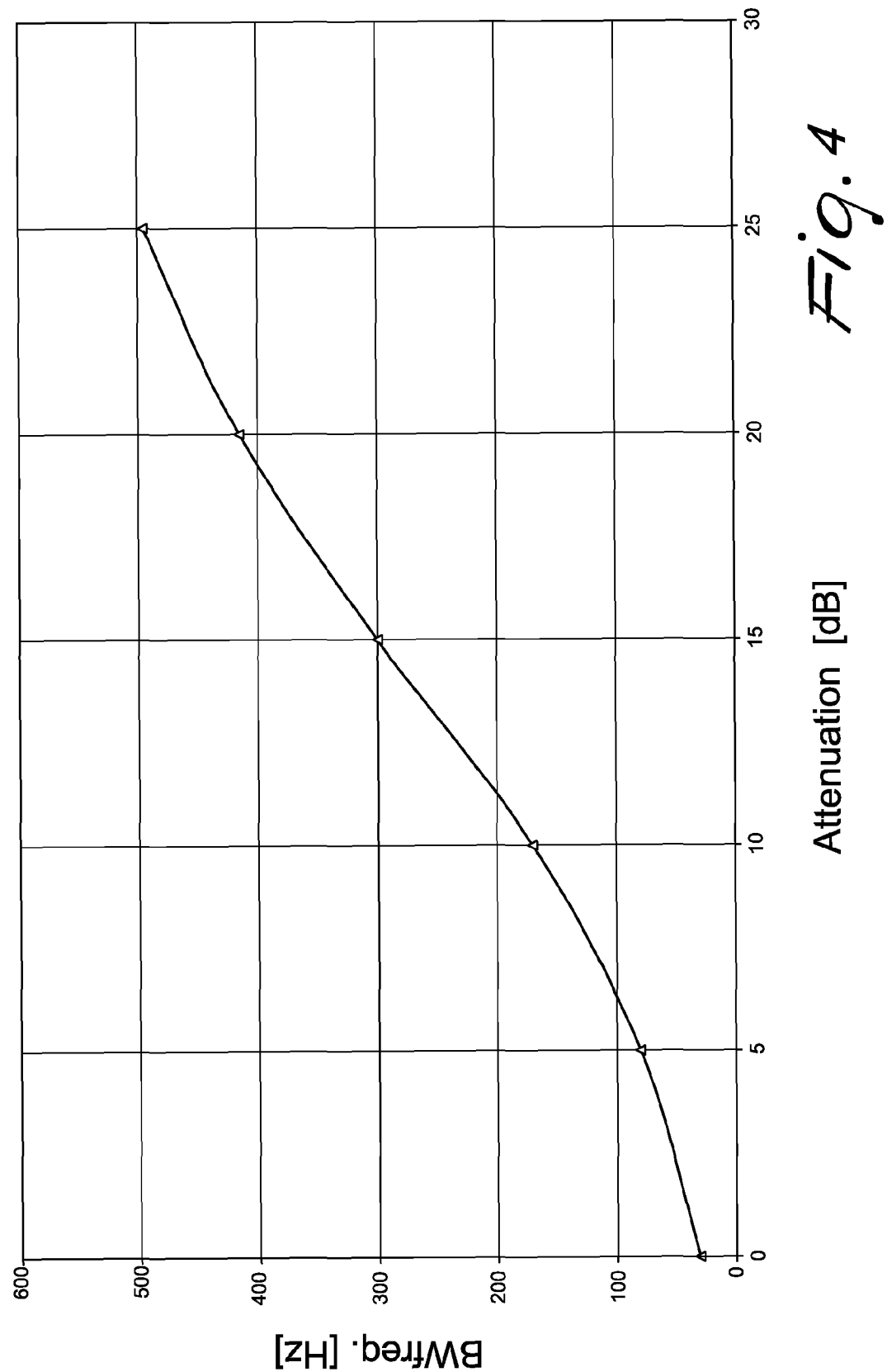
FIG. 4 is a possible curve of the bandwidth versus attenuation input level in a known PIN-diode AGC circuit as shown in FIGS. 1 and 2.

In Fig. 4, Sheet 4 of 12, delete "Bandwitdh" and insert -- Bandwidth --, therefor.

In Fig. 7, Sheet 7 of 12, delete "Bandwitdh" and insert -- Bandwidth --, therefor.

In the Specification

In Column 4, Lines 11-12, delete "Automatic Gain Control AGC" and insert -- Automatic Gain Control (AGC) --, therefor.

In the Claims

In Column 13, Line 39, in Claim 8, delete "lain" and insert -- gain --, therefor.

Signed and Sealed this
Twenty-fifth Day of November, 2014

Michelle K. Lee
*Deputy Director of the United States Patent and Trademark Office*